(12) United States Patent
Cerutti et al.

(10) Patent No.: US 6,535,149 B1
(45) Date of Patent: Mar. 18, 2003

(54) DEVICE FOR COMPRESSING/DECOMPRESSING BIT STRINGS

(75) Inventors: Walter Cerutti, Ivrea (IT); Gianpiero Bianco, Ivrea (IT)

(73) Assignee: Olivetti Tecnost, S.p.A., Ivrea (IT)

(*) Notice: Subject to any disclaimer, the term of this patent is extended or adjusted under 35 U.S.C. 154(b) by 0 days.

(21) Appl. No.: 09/959,438

(22) PCT Filed: Apr. 14, 2000

(86) PCT No.: PCT/IT00/00152

§ 371 (c)(1),
(2), (4) Date: Oct. 25, 2001

(87) PCT Pub. No.: WO00/65725

PCT Pub. Date: Nov. 2, 2000

(30) Foreign Application Priority Data

Apr. 26, 1999 (IT) .......................................... TO99A0336

(51) Int. Cl.[7] .............................................. H03M 7/00
(52) U.S. Cl. ................................. 341/50; 57/60; 57/65; 57/67
(58) Field of Search ............................. 341/50, 57, 60, 341/65, 67, 85

(56) References Cited

U.S. PATENT DOCUMENTS

| | | | |
|---|---|---|---|
| 4,646,061 A | * 2/1987 | Bledsoe ........................ | 341/65 |
| 4,700,175 A | * 10/1987 | Bledsoe ........................ | 341/65 |
| 4,899,147 A | * 2/1990 | Schiavo et al. ............. | 341/106 |
| 5,321,398 A | 6/1994 | Ikeda | |
| 5,389,922 A | * 2/1995 | Seroussi et al. ............... | 341/51 |
| 5,436,626 A | 7/1995 | Fujiwara et al. | |
| 5,625,356 A | * 4/1997 | Lee et al. ...................... | 341/67 |
| 5,717,393 A | * 2/1998 | Nakano et al. ................. | 341/50 |
| 5,808,570 A | * 9/1998 | Bakhmutsky ................. | 341/65 |
| 5,821,886 A | * 10/1998 | Son .............................. | 341/67 |
| 6,157,326 A | * 12/2000 | Van Der Vleuten et al. .. | 341/65 |

OTHER PUBLICATIONS

Hao–Chieh Chang, et al.: "A VLSI architecture design of VLC encoder for high data rate vide/image coding" ISCAS'99. Proceedings of the 1999 IEEE International Synposium on Circuits and Systems VLSI (Cat. No. 99CH36349), ISCAS'99. Proceedings of the 1999 IEEE International Symposium on Circuits and Systems, VLSI, Orlando, FL, USA May 30–Jun. 2, 1999, p. 398–401 vol. 4, XP002145588 1999, Piscataway, NJ USA, IEEE, USA.

Shaw–Min Lei, et al.: "An Entropy Coding System for Digital HDTV Applications" IEEE Transactions on Circuits and Systems for Video Technology, US, IEEE Inc. New York, vol. 1, No. 1, Mar. 1, 1991, pp. 147–155.

Kovac, M., et al: "JAGUAR: A Fully Pipelined VLSI Architecture for JPEG Image Compression Standard", Proceedings of the IEEE, US, IEEE, New York, vol. 83, No. 2, Feb. 1, 1995, pp. 247–257, XP000501243.

\* cited by examiner

*Primary Examiner*—Michael Tokar
*Assistant Examiner*—Lam T. Mai
(74) *Attorney, Agent, or Firm*—Banner & Witcoff, Ltd.

(57) ABSTRACT

This invention relates to an electronic device, for a fax machine in particular, comprising controlling means (11) capable of associating compression codes or code words with strings of source information in accordance with a first processing speed, and storing means, for example shift registers (31, 32) capable of appending the code words to one another so as to form blocks of compressed information, in accordance with a second processing speed, greater than the first. The device is also capable of "extracting" the single code words from blocks of compressed information at this second processing speed. By way of the technique of using different processing speeds, the device makes it possible to obtain total speeds of compression and/or decompression of the information respectively to be transmitted and/or received much greater than those obtainable up to now with the known devices.

6 Claims, 3 Drawing Sheets

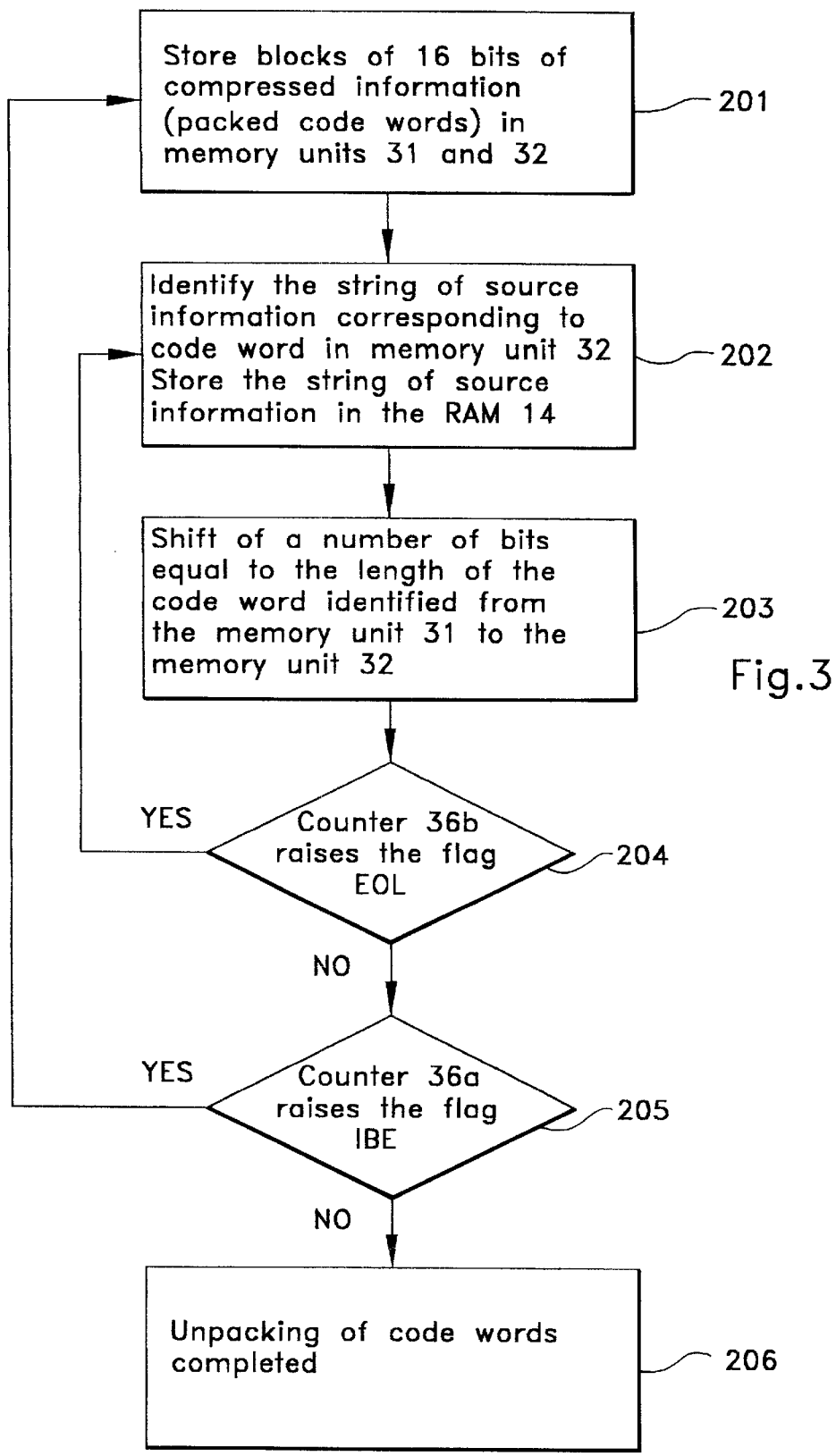

DEVICE FOR COMPRESSING/DECOMPRESSING BIT STRINGS

This is a U.S. National Phase Application Under 35 USC 371 and applicant herewith claims the benefit of priority of PCT/IT00/00152 filed Apr. 14, 2000, which was published Under PCT Article 21(2) in English and Application No. TO99A000336 filed in Italy on Apr. 26, 1999.

TECHNICAL FIELD

This invention relates to a device for compressing/decompressing bit strings comprising control means having a first processing speed and suitable for associating bit strings of a source information with corresponding compression codes.

In particular, the present invention relates to an electronic device for equipment for transmitting and receiving facsimiles (fax machines).

BACKGROUND ART

It is known that equipment such as, for example, fax machines are suitable for compressing the information to be transmitted (source information) and for decompressing the compressed information received.

It is also known that in fax machines the information to be transmitted is compressed and the information received is decompressed in accordance with suitable standards, for instance the T.4 standard of the International Telecommunications Union (ITU-T).

For example, it is known that during transmission the fax machine reads the source information in the form of rows of bits having, for example, horizontal and vertical resolution of 200 dots by 25.4 mm and compresses the information, consisting of sequences of white dots (white run length) or black dots (black run length), in accordance with the above-mentioned standard T.4, associating with sequence of bits of the same sign a code word of length between 2 and 13 bits.

It is also known that the compression operations, which consist in associating with each sequence of bits of the same sign the corresponding code word and in appending the code words in such a way as to form blocks of information comprising an integral number of bytes, are executed by the fax machine by means of its central unit (CPU) and appropriate programs stored in the memory of the fax machine itself.

In particular it is known that the appending of the code words, is extremely demanding of the fax machine's CPU and consequently requires high processing times.

In fact, the appending operation requires the CPU to operate in its own internal registers manipulating, not an integral number of bytes, but the bits and one by one at that, since the "code words" are strings of bits of variable length. For example, in order to append a "code word" 13 bits long and another one 3 bits long the CPU of a fax machine will have to execute the following operations: load the first code word in a first register, load the second code word in a second register and copy the second code word bit by bit from the second register to the first.

It is therefore obvious to those acquainted with the sector art that, assuming that the CPU takes at least 3 clock beats for each elementary instruction, the simple appending of a code word of 3 bits to another one of 13 bits requires at least 5 elementary instructions of the CPU and therefore at least 15 clock beats.

From the above example, it emerges that in a fax machine the compression times and, in particular, those for appending the code words in such a way as to form blocks of bytes, are generally high and are very closely dependant on the clock and the power of the CPU used.

Naturally the same remarks about the limits of the known art can also be applied to the decompression operations which consist in identifying, "extracting" or "unpacking" the single code words from blocks of information received and in reconstructing the source information on the basis of the code words identified.

In short, it is obvious that the compression and decompression times, in a fax machine for example, are for the known art a bottle-neck which is difficult to negotiate and avoided by using particularly fast or special CPU's.

It is also known, from the U.S. Pat. No. 5,436,626, a variable length encoder, used in high speed data transmission, which associates bit strings of a source information with corresponding compression codes at a first processing speed, and which appends the compression codes in order to form blocks of compressed information at a second processing speed greater than the first processing speed. However the disclosure of the U.S. Pat. No. 5,436,626 is performed in broad terms and concerns essentially only the main and general features of this variable length encoder. In particular the latter is proposed merely for a wide and generic use in the high-speed data transmission field. Therefore such document is very far from entering into the details which allow this variable length encoder to be implemented and to be improved as efficiency in more specific and limited fields, as for example the data transmission in a facsimile machine.

DISCLOSURE OF THE INVENTION

The object of this invention is to untie, in particular in a fax machine, the operations of compression of the source information and/or decompression of the compressed information received from the characteristics of the CPU used and, at the same time, to improve the times of these operations by at least a factor of 10.

This technical problem is solved by the device for compressing/decompressing bit strings characterised by storing means, having a second processing speed greater than the first processing speed, connected to the control means and suitable for appending the compression codes one to another in order to form blocks of compressed information, whereby the blocks of compressed information are suitable for being manipulated as blocks by the control means.

According to another characteristic, the device implements a new method for compressing/decompressing bit strings characterised in that the functions of appending compression codes (compression) and extracting compression codes (decompression) are performed bit by bit at a processing speed much greater than that of the CPU used by the fax.

BRIEF DESCRIPTION OF DRAWINGS

This and other characteristics of the present invention will become clear from the description that follows of a preferred embodiment, provided by way of a non-restricting example, and with reference to the accompanying drawings, where.

BEST MODE FOR CARRYING OUT THE INVENTION

Figure 1:
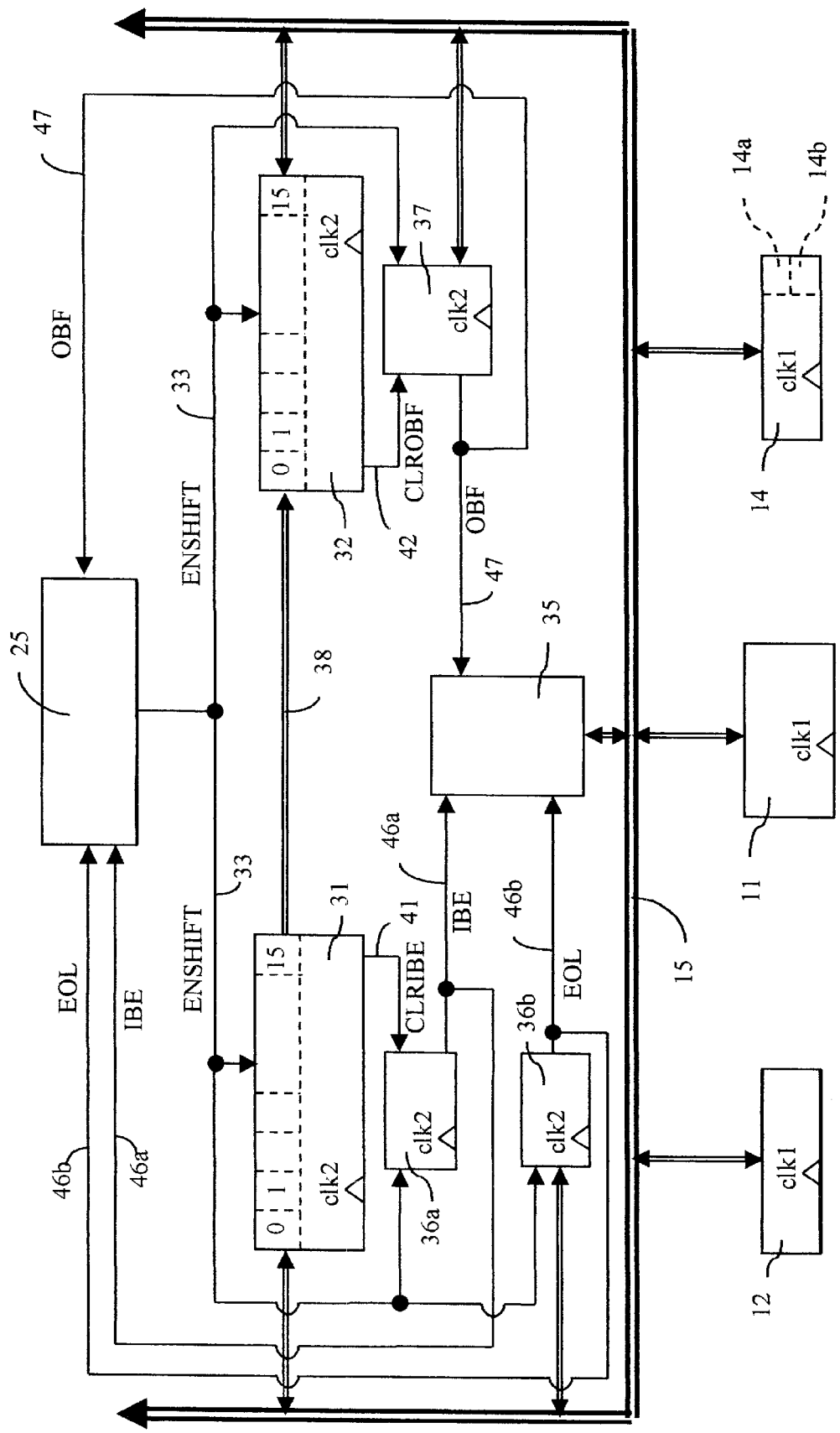
FIG. 1 Represents a logic diagram of the device according to the invention.
Figure 2:
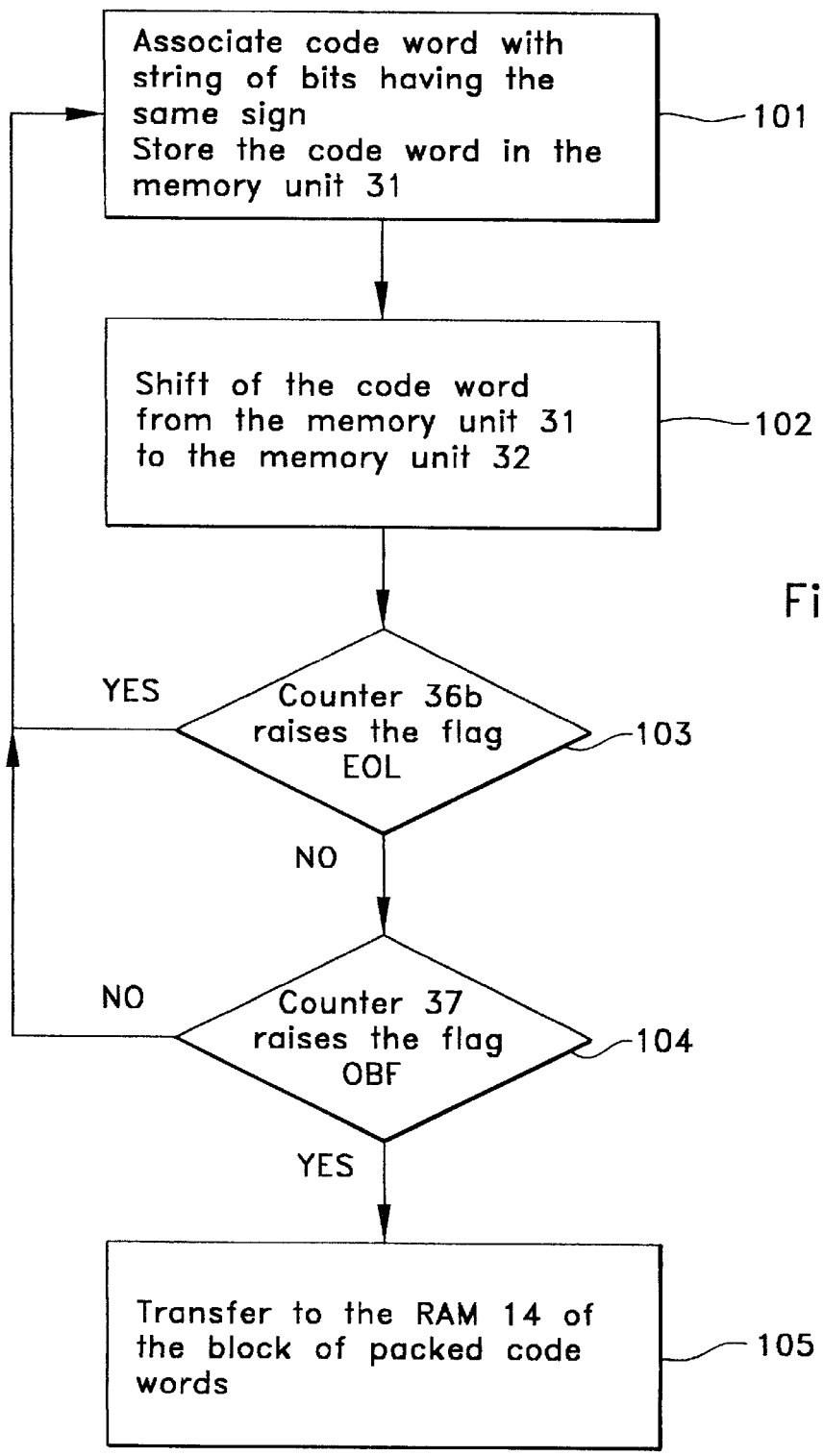

With reference to FIG. 1 the device according to the invention comprises a central processing unit (CPU) 11, of known type, a read only memory (ROM) 12, known in itself, suitable for storing data and programs developed in the stage of designing the device and a random access memory (RAM) 14, suitable for storing the information on which to effect the compression and/or decompression transformations.

In particular the RAM 14, of known type, is suitable for storing in a first zone 14a strings of code words appended in such a way as to constitute blocks of bytes of compressed information and in a second zone 14b strings of source information.

The CPU 11, the ROM 12 and the RAM 14 are connected together, in a known way, by means of a data and address channel (bus) 15, and are timed, in accordance with this embodiment, at a first clock speed (clk1).

The device also comprises, as elements characterising this invention, an encoder circuit 25, an input register 31, a first and a second counter, 36a and 36b, associated with the input register 31, an output register 32, a further counter 37, associated with the output register 32, and a status register 35.

The encoder 25, of known type, has an output 33 connected to the input register 31, to the pair of counters 36a and 36b, to the output register 32 and to the counter 37; the encoder 25 has also a first input connected to the first counter 36a, a second input to the second counter 36b and a third input to the counter 37.

The encoder 25 is suitable for commanding, by means of a signal "ENSHIFT" on the connection 33, the "shifting" of the input register 31, of the pair of counters associated therewith, 36a and 36b, of the output register 32 and of the associated counter 37 and for blocking this shifting in the presence of signals "IBE", "EOL" and/or "OBF" coming respectively from the counters 36a, 36b and/or 37, as will be described later in detail.

The input register 31, for example a 16-bit shift register of known type, has a data input connected to the bus 15, a data output 38 connected to the output register 32, a control output 41 connected to the counter 36a, and is timed, as regards the shifting, at a second clock speed (clk2) generally greater by a few numerical factors than clk1.

The input register 31 is suitable for receiving and storing, through the bus 15 and under the control of the CPU 11, blocks of compressed information and, simultaneously with this storing, for transmitting to the counter 36a a signal suitable for lowering a buffer empty flag or "CLRIBE" by means of the control output 41.

The input register 31, in accordance with a further characterising element of this invention, is suitable for performing the shifting at the speed clk2, depending on whether the signals "ENSHIFT" are present on the connection 33, and for transferring, during the shifting, code word bits to the output register 32 by means of the connection 38.

The first counter 36a, associated with the input register 31, for example a counter by 16 of known type, has a control output (first counter output) 46a connected to the status register 35 and to the encoder 25, and is suitable for generating a buffer empty signal or flag "IBE" once the shifting of the input register 31 is completed (reading of a block of 16 bits of compressed information) and for lowering this flag in the presence of the signal "CLRIBE".

The second counter 36b, associated with the input register 31, for example a counter by 16 of known type, has a data input connected to the bus 15 and a control output (second counter output) 46b connected to the status register 35 and to the encoder 25.

The second counter 36b is suitable for storing, by means of the bus 15 and under the control of the CPU 11, the length of the code words identified, as will be described later in detail.

Furthermore, the counter 36b is suitable for generating on the output 46b an end-of-length signal (flag) of the code word identified, or "EOL", once the count equal to this length has been completed, and for lowering the flag "EOL" at the same time as a new length of an identified code word is stored in the same counter 36b.

The output register 32, for example a 16-bit shift register of known type, has a data input/output connected to the bus 15 and a control output 42 connected to the corresponding counter 37, and is timed, as regards the shifting, in accordance with clk2.

The output register 32 is suitable for exchanging, under the control of the CPU 11, 16-bit blocks of compressed information with the zone 14a of the RAM 14 and for transmitting an output buffer empty signal "CLROBF" to the counter 37 upon transfer of these blocks of compressed information from the output register 32 to the RAM 14.

In particular, the output register 32 is suitable for effecting at the clk2 speed the shifting depending on whether signals "ENSHIFT" are present on the connection 33 and for storing during the shifting, code word bits transferred thereto by the input register 31 by means of the connection 38.

The counter 37, associated with the output register 32, for example a counter by 16 of known type, has a control output (counter output) 47 connected to the status register 35 and to the encoder 25, and is suitable for generating a buffer full signal (flag) "OBF" once the shifting of the output register 32 (writing of the block of compressed information) has been completed and for lowering this flag in the presence of the signal "CLROBF".

The status register 35, of known type, is connected to the bus 15 and is suitable for being selected and read by the CPU 11 so as to detect or intercept the presence of the flag "IBE" and/or "EOL" and/or "OBF" so that they may be managed by the said CPU 11.

The operation of the system as described up to now is as follows.

Compression of Source Information

Where compression has to be performed of source information to be transmitted, stored for example in the zone 14b of the RAM 14, the CPU 11, as a first step, reads from the zone 14b a first string of bits having the same sign, associates a code word with this string, by means of predefined programs and tables stored in the ROM 12, and stores in the input register 31 the code word identified and in the counter 36b the length of this code word.

With these operations completed, the device, in a second step, starts the shifting of the registers 31 and 32, and of the counters 36a, 36b and 37, at the clk2 speed and continues to transfer the bits of the code word identified from the input register 31 to the output register 32 until the counter 36b raises the flag "EOL" to the encoder 25 in order to block the shifting and to the status register 35 so that the flag is intercepted and controlled by the CPU 11.

The CPU 11, once the flag "EOL" has been intercepted, in a third step reads from the zone 14b a second string of bits having the same sign, associates a new code word with this string and stores the code word in the input register 31 and the length of the code word identified in the counter 36b so that the counter 36b lowers the flag EOL and the device resumes the shifting at the clk2 speed as already described in the second step above.

If during the transfer of the bits of the code word from the input register 31 to the output register 32, the latter becomes full, the counter 37 transmits the output buffer full flag or "OBF" to the encoder 25 and to the status register 35; whereupon, the encoder 25, in a fourth step, blocks the shifting of the registers 31 and 32 and of the counters 36a, 36b and 37, and the CPU 11, once the flag "OBF" has been intercepted, commands, at the clk1 speed, the transfer to the zone 14a of the RAM 14, of the block of compressed information contained in the output register 32, in such a way that, following the emptying of the output register 32 and the corresponding emptying signal or "CLROBF", the device resumes the shifting at the clk2 speed and continues to transfer the bits of the code word from the input register 31 to the output register 32.

From this time on, the device continues the shifting in the same way as already described in the second step above and successive steps until compression of the source information has been completed.

Decompression of Compressed Information

Where the decompression has to be performed of compressed information received and memorised, for example, in the zone 14a of the RAM 14, the CPU 11, as a first step, reads a first and a second block of 16 bits from the zone 14a of the RAM 14 and stores them, respectively, in the output register 32 and in the input register 31.

The CPU 11, in a second step, extracts from the output register 32 the block of 16 bits stored and, by means of programs and tables stored in the ROM 12, identifies a code word and the corresponding string of bits of source information; consequently the CPU 11 stores the string of source information in the zone 14b of the RAM 14 and the length of the code word identified in the second counter 36b, in such a way that the device starts the shifting of the registers 31 and 32, and of the counters 36a, 36b and 37, at the clk2 speed and transfers a number of bits equal to the length of the code word identified from the input register 31 to the output register 32; this transfer continues until when the counter 36b transmits the flag "EOL" to the encoder 25 and to the status register 35, respectively, to block the shifting and so that the flag is intercepted and managed by the CPU 11.

Once the flag "EOL" has been intercepted, the CPU 11, in a third step, extracts a block of 16 bits from the output register 32 and repeats what has already been described in the second step.

If during the second step, namely during the transfer of the bits from the input register 31 to the output register 32, the input register 31 becomes empty, the counter 36a raises the input buffer empty flag or "IBE" to the encoder 25 and to the status register 35; consequently, the encoder 25, in a fourth step, blocks the shifting of the registers 31 and 32 and of the counters 36a, 36b and 37, and the CPU 11, once the flag "IBE" has been intercepted, commands, at the clk1 speed, the transfer from the zone 14a of the RAM 14 to the input register 31 of a further block of 16 bits of compressed information, in such a way that, following the filling of the input register 31 and of the simultaneous clearing of the buffer empty flag or "CLRIBE", the device resumes the shifting at the speed clk2 and continues to transfer the bits from the input register 31 to the output register 32 until the counter 36b raises the flag "EOL" to the encoder 25 and to the status register 35, respectively, to block the shifting and so that the flag is intercepted and managed by the CPU 11.

From this time on, the device continues in the same way as already described in the second step above and successive steps until decompression of the information received has been completed.

From the examples of compression/decompression described above, it may readily be deduced that the device according to the invention allows the manipulation of the single bits at a clock speed (clk2) much greater than the clock speed (clk1) of the CPU with the significant result that the times for appending code words and/or for "unpacking" or "extracting" the code words are much lower than those obtainable with the known devices.

Naturally the length of the input and of the output register 31 and 32, and of the counters 36a, 36b and 37, may be different from that described in this embodiment without departing from the spirit of the invention.

In addition, the device according to this invention is independent of the type of algorithm used for compressing and/or decompressing the information.

Changes may be made to the dimensions, shapes, materials, components, circuit elements, connections and contacts, as also to the circuitry and construction details illustrated and to the method of operation without departing from the spirit of this invention.

What is claimed is:

1. Device for packing code words having different bit length comprising a processing unit (11) having a first clock speed (clk1) and provided for associating bit strings of a source information with corresponding code words; and memory units (31, 32) connected to said processing unit (11) and having a second clock speed (clk2) greater than said first clock speed (clk1), said memory units (31, 32) being provided for appending one to another said code words having different bit length in order to form blocks of packed code words having a uniform bit length;

wherein said processing unit (11) is provided for manipulating said blocks of packed code words in accordance with said first clock speed (clk1).

2. Device according to claim 1 characterised in that said memory units (31, 32) comprise a first shift register (31) connected to said processing unit (11) and provided for storing said code words; and a second shift register (32) connected to said first shift register (31) and provided for storing in sequence from said first shift register (31) single bits of said code words in order to form said blocks of packed code words having a uniform bit length.

3. Device for unpacking code words having different bit length comprising a processing unit (11) having a first processing speed (clk1) and provided for processing blocks of packed code words having a uniform bit length in order to identify single code words; and memory units (31, 32) connected to said processing unit (11) and having a second clock speed (clk2) greater than said first clock speed (clk1);

wherein said memory units (31, 32) are provided for "extracting" said single code words from said blocks of packed code words at said second clock speed (clk2).

4. Device according to claim 3 wherein said memory units (31, 32) comprise
- a first shift register (31) connected to said processing unit (11) and provided for storing said blocks of packed code words having a uniform bit length; and
- a second shift register (32) connected to said first shift register (31) and provided for extracting in sequence bit by bit said single code words from said blocks of packed code words having a uniform bit length.

5. Method for packing code words having different bit length with an electronic device comprising the steps of
- associating bit strings of a source information with corresponding code words by using a processing unit (11) having a first clock speed (clk1);
- appending one to another said code words in order to form blocks of packed code words having a uniform bit length by using memory units (31, 32) having a second clock speed (clk2) greater than said first clock speed (clk1); and
- manipulating said blocks of packed code words having a uniform bit length by means of said processing unit (11) in accordance with said first clock speed (clk1).

6. Method for unpacking code words having different bit length with an electronic device comprising the steps of
- processing blocks of packed code words having a uniform bit length in order to identify single code words by using a processing unit (11) having a first clock speed (clk1); and
- "extracting" single code words from said blocks of packed code words having a uniform bit length by using memory units (31, 32) having a second clock speed (clk2) greater than said first clock speed (clk1); wherein the processing step is performed by said processing unit (11) when operating at said first clock speed (clk1).

* * * * *